[19] United States Patent
Vonder et al.

[11] 4,322,709
[45] Mar. 30, 1982

[54] ADJUSTABLE FLUX GENERATOR A MAGNETICALLY ACTIVATED ELECTRONIC SWITCH

[75] Inventors: David L. Vonder, Addison; Frank J. Petkewicz, Chicago, both of Ill.

[73] Assignee: GTE Automatic Electric Labs Inc., Northlake, Ill.

[21] Appl. No.: 196,952

[22] Filed: Oct. 14, 1980

[51] Int. Cl.³ .................................................. H01L 43/04
[52] U.S. Cl. .................................. 338/32 H; 323/368;
324/117 H; 335/298
[58] Field of Search ................. 338/32 H, 32 R;
323/368; 335/298; 357/27; 324/251, 252, 235,
117 H, 133; 329/200; 307/278, 239, 309, 116

[56] References Cited
U.S. PATENT DOCUMENTS 3,369,206 2/1968 Lundkvist ..................... 335/298 X
3,781,735 12/1973 Haas ............................. 335/298
4,218,626 8/1980 Fukuda et al. ............... 338/32 H X Primary Examiner—C. L. Albritton
Attorney, Agent, or Firm—Robert J. Black; Anthony Miologos

[57] ABSTRACT

An adjustable flux generator used in conjunction with a Hall effect switch, comprising a coil and a magnetic circuit including an adjustable core. The coil produces a field of magnetic flux in response to the presence of an electrical current which is transmitted via the magnetic circuit to the Hall effect switch. The adjustable core is disposed to be manually adjusted to control the amount of magnetic flux delivered to the Hall effect switch. When the flux exceeds the Hall switch operate point the switch produces an output signal.

14 Claims, 7 Drawing Figures

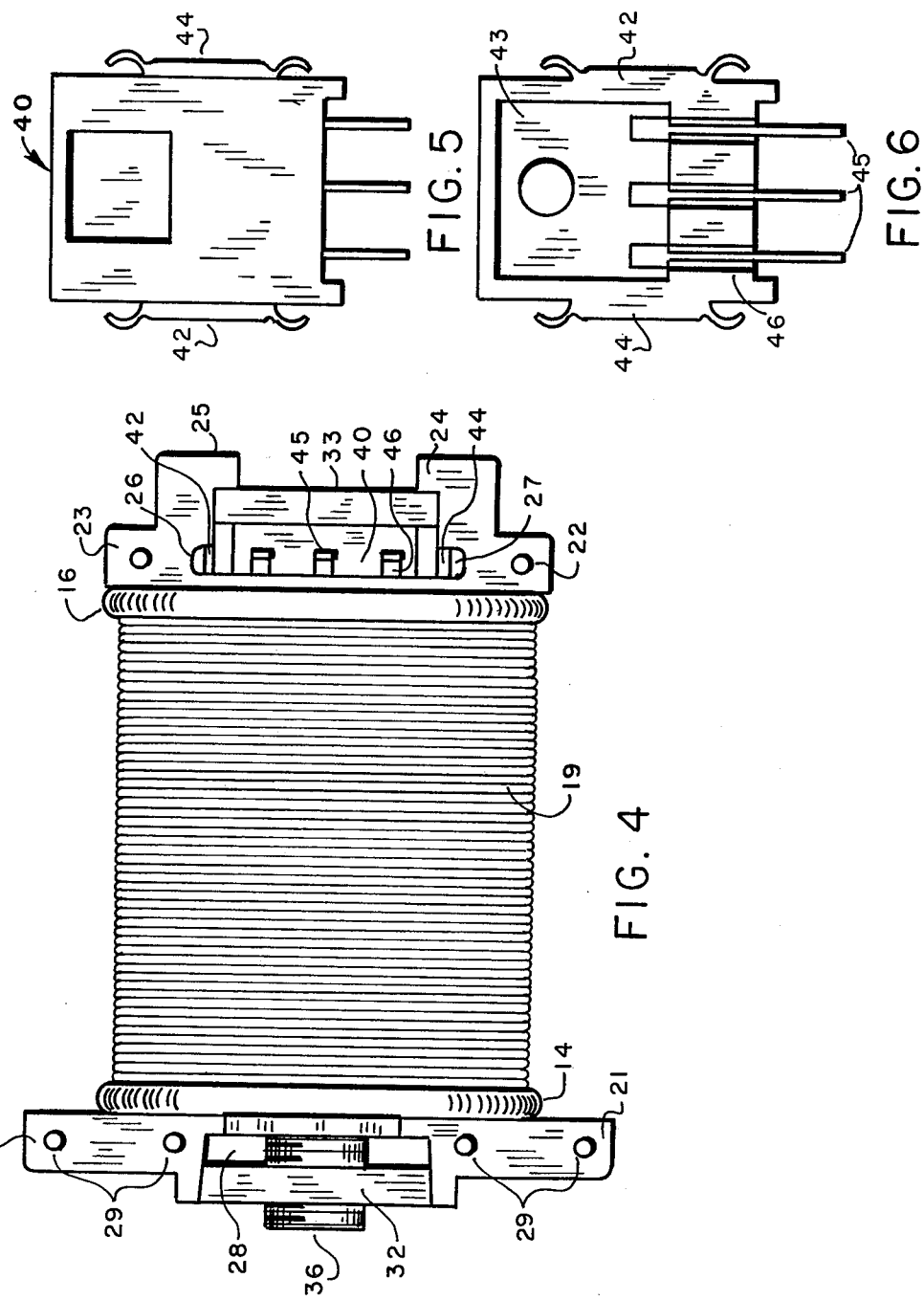

ADJUSTABLE FLUX GENERATOR A MAGNETICALLY ACTIVATED ELECTRONIC SWITCH

BACKGROUND OF THE INVENTION (1) Field of the Invention

The present invention relates in general to electromagnetic switches and more particularly to an electromagnetic device used to control the operate and release characteristics of a magnetically activated electronic switch.

(2) Description of the Prior Art

Magnetically activated electronic switches or "Hall effect" digital switches utilize the Hall effect for sensing a magnetic field. That is, a Hall cell included in the switch senses a magnetic field and provides electrical outputs corresponding to the presence or absence of a magnetic flux. Such a Hall effect switch is the Sprague ULS-3006T which other than the Hall cell, includes an amplifier, trigger and output stages integrated into a single monolithic chip. These relatively inexpensive solid state devices are compact and highly reliable. Further, since switching is done without the need of contacts they are not prone to contact bounce and thus are well suited in digital electronic applications.

Operationally these switches are configured in either a normally "off" or a normally "on" configuration. In the normally "off" configuration an output transistor in the output stage of the switch is normally off when the magnetic field perpendicular to the surface of the Hall cell is below a threshold or "operate point". When the field exceeds the "operate point" the output transistor switches on and is capable of sinking a set amount of current. The output transistor switches off when the magnetic field is reduced below the "release point" which is less then the "operate point". The normally "on" devices output transistor sinks current and is on when the magnetic field is below the threshold or "operate point" and switches off when the field exceeds the "operating point". The hysterisis characteristics provide for unambiguous or non-oscillatory switching regardless of the rate of change of the magnetic field.

These devices are finding increased usage as sensor devices which can detect either a current or electrical potential and trigger a signal such as to a digital computer or to an alarm device. Such an application is described in U.S. Pat. No. 4,104,488 titled "Subscriber Line Circuit" to D. A. Weir et al., issued May 19, 1977. The Weir patent teaches Hall effect devices which are incorporated to detect line looping, dialing and ring-trip sensing in a telephone system.

A problem associated with the Hall effect switches is that the sensitivities or the operate and release thresholds of the devices vary from device to device.

This can be solved by purchasing a large number of devices, testing and using only those devices which fit certain circuit characteristics. Or on the other hand designing the circuit characteristics around a specific operate and release sensitivity and fiting the appropriate Hall switch to these characteristics. In any event, these methods are costly and wasteful in both material and engineering which ultimately would make a final product very expensive.

One method of solving this problem and therefore the object of this invention is to provide an electromagnetic device that is capable of varying the amount of magnetic flux delivered to the Hall effect switch in order to tailor the operate sensitivities of the Hall effect switch to the desired operate and a non-operate characteristics of the electromagnetic device.

SUMMARY OF THE INVENTION

The present invention is an electromagnetic device employing a magnetically activated electronic switch or Hall switch to detect the presence or absence of an electrical current and output a corresponding signal.

The device consists of a magnetic flux generator, a magnetic circuit including an adjustable core and a Hall switch.

The magnetic flux generator produces a field of magnetic flux in response to the presence of an electrical current which is transmitted to the Hall switch via the magnetic circuit. The Hall switch is mounted within an air gap formed by the magnetic circuit and adjacent to one end of the adjustable core. The core is disposed to be adjusted toward or away from the switch effectively increasing or decreasing the flux density delivered to the Hall switch. In this manner the operating characteristics of the device may be tailored to the sensitivity of Hall switch.

Depending upon the type of Hall switch used, i.e. "normally on", or "normally off", the Hall switch produces an output signal corresponding to the absence of a magnetic flux and conversely an output signal corresponding to the presence of a magnetic flux.

While the description of a single Hall switch device described above can be used in many applications the availability of Hall switches having various sensitivities can be also used to advantage.

In this case two Hall switches having different operating and release points are mounted on an electromagnetic device having a single flux generator and a magnetic circuit including two adjustable cores. Each Hall switch is situated adjacent a respective core in the same manner as a single Hall switch device. The first Hall switch for example may have an operating point lower than the second, where a current of a first value would activate the first Hall switch and produce an output signal and current of a second higher value activate the first and second Hall switches. Again the adjustable core would tailor the operating characteristics of the device to each of the sensitivities of the Hall switches.

Finally, the availability of the Hall switches in a "normally on" and "normally off" type can be used to advantage in the form of a relay device.

A contactless electromagnetic relay may be fashioned consisting of a single flux generator, two magnetic circuits and at least two Hall switches. The first switch would be a normally on device and the second a normally off. With no current applied the first Hall switch would output a signal corresponding to its on condition and the second device output a signal corresponding to its off condition. Applying a current would turn off the first device again outputting a corresponding off signal and turn on the second device outputting its on signal.

While describing the relay as having two Hall switches any number and type of switches may be employed for particular switching applications. For example, the relay may include three normally on Hall switch types and two normally off or any number of combinations.

BRIEF DESCRIPTION OF THE DRAWINGS

A better understanding of the invention may be had from the consideration of the following detailed description taken in conjunction with the accompanying drawings in which:

FIG. 4 is a bottom view of the assembled electromagnetic device.

FIG. 5 is a rear elevational view of a magnetically activated electronic switch carrier in accordance with the present invention described herein.

FIG. 6 is a front elevational view of the switch carrier.

DESCRIPTION OF THE PREFERRED EMBODIMENT

Figure 1:
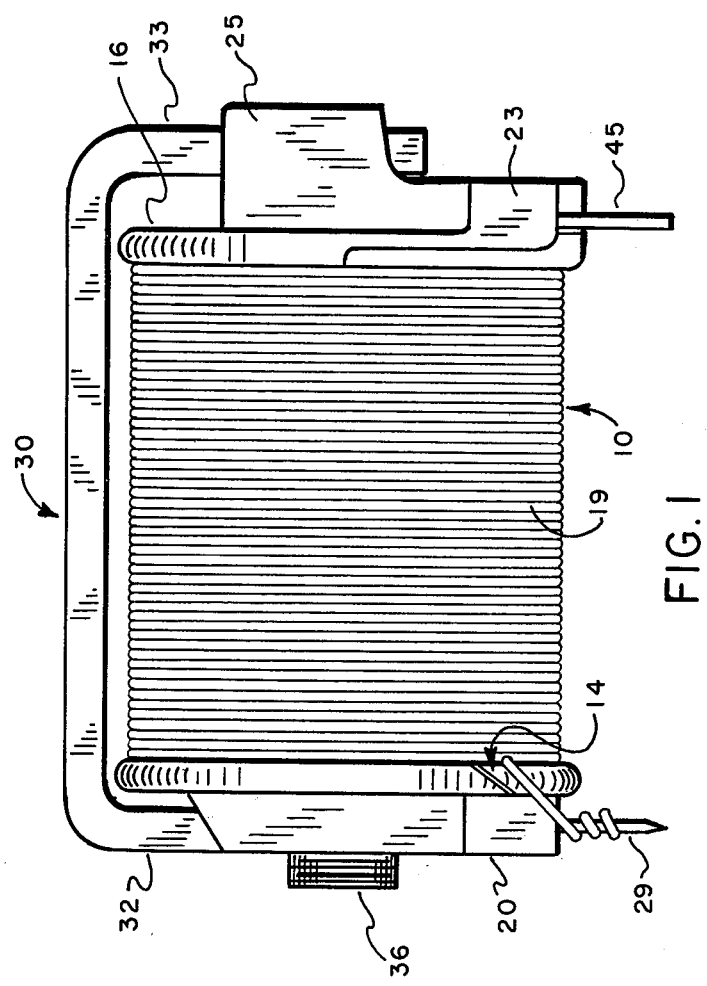
FIG. 1 is a side elevational view of an electromagnetic device utilizing a single magnetically activated electronic switch in accordance with the present invention described herein.
Figure 3:
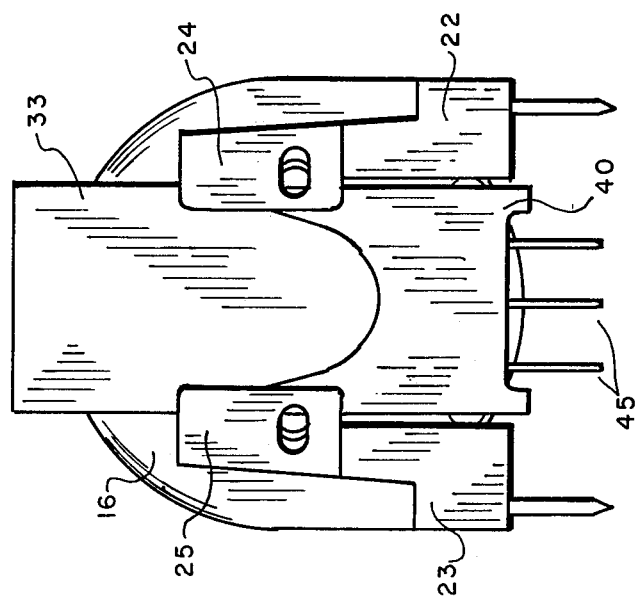
FIG. 3 is a rear end elevational view of the assembled electromagnetic device.
Figure 2:
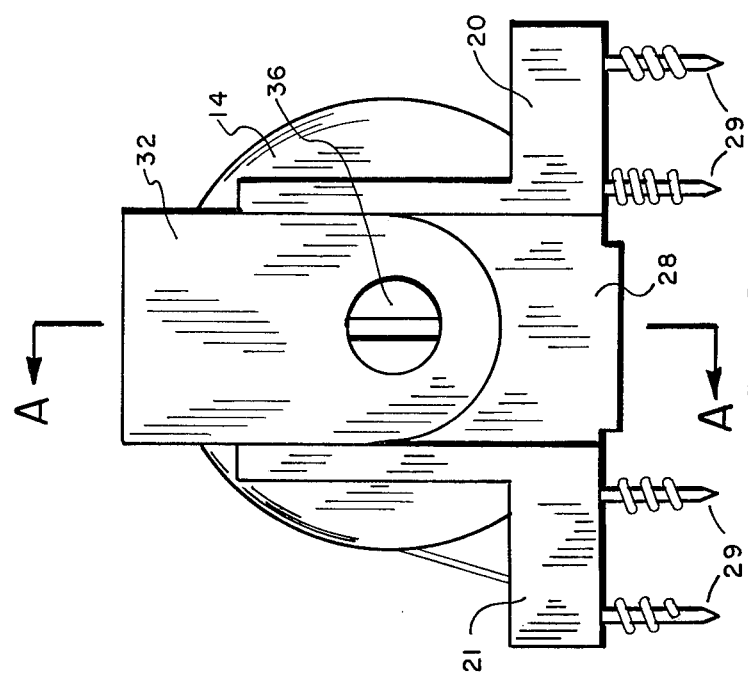
FIG. 2 is a front end elevational view of the assembled electromagnetic device.
Figure 7:
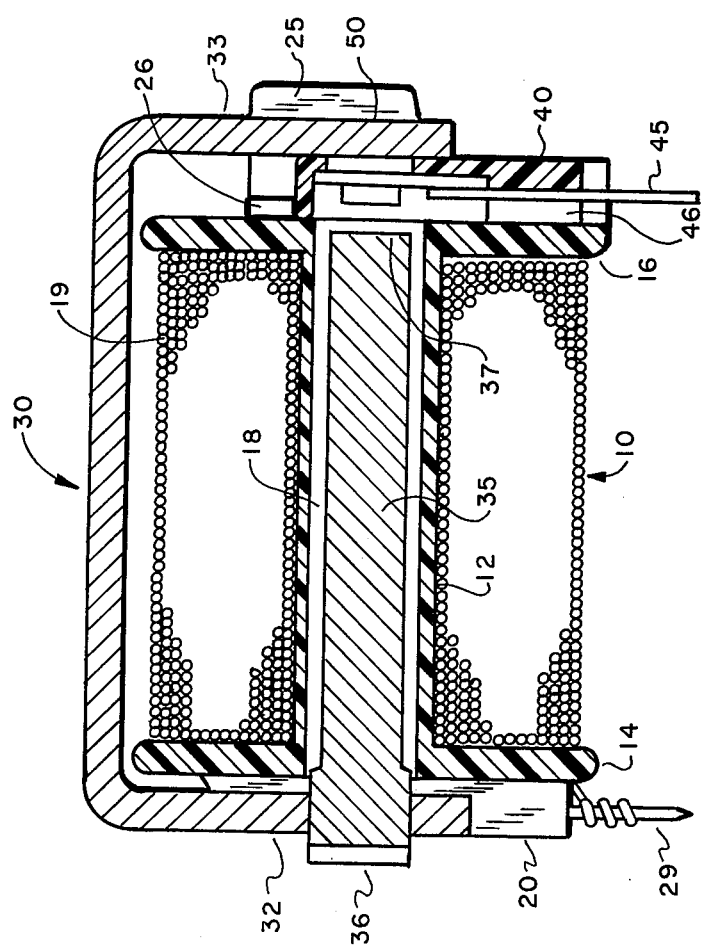
FIG. 7 is a sectional view taken substantially along line A—A of FIG. 2.

Turning now to FIGS. 1 and 7 the device of the present invention includes a magnetic flux generator 10 having a molded bobbin of insulative material and comprised of a body portion 12 and flanges 14 and 16 on opposite ends of body 12. A coil of wire 19 is wound about the body portion intermediate flanges 14 and 16. Body portion 12 further includes a longitudinal bore 18 running through the body portion and both flanges 14 and 16. The exterior surface of flange 14 includes L-shaped members 20 and 21 integrally molded ot its surface forming a channel 28 therebetween as can be seen in FIG. 2. Turning now to FIG. 3 flange 16 also includes L-shaped members 22 and 23 integrally molded and extending outward of its exterior surface and similarly L-shaped arms 24 and 25 extending from members 22 and 23.

Terminal posts 29 extend from L-shaped members 20 and 21 and are arranged to connect coil 19 to a source of electrical current allowing the flux generator to generate a magnetic field when current is applied.

Returning back to FIGS. 1 and 7, the device further includes a magnetic circuit comprised of a U-shaped return strap 30 composed of a suitable conductor material and a ferromagnetic core 35. A first leg 32 of return strap 30 is arranged to be held in channel 28 on flange 14 and a second leg 33 is held within channel 50. Channel 50 is formed by L-shaped arms 24 and 25 of flange 16. Leg 32 of return strap 30 includes a threaded bore centrally located on the leg and arranged to accept a threaded end portion 36 of ferromagnetic core 35 allowing core 35 to be adjustably housed within bobbin bore 18. An air gap is formed in the magnetic circuit between the cores' end 37 and leg 33 of the return strap. The magnetic flux generated by coil 19 is transmitted by core 35 through the air gap and back to the core via return strap 30.

It can be appreciated that by manually adjusting portion 36 of core 35 the distance between core end 37 and return strap leg 33 can be increased or decreased and thus decreasing or increasing respectively the density of the flux transmitted through the air gap.

The device is completed by a Hall switch carrier 40, illustrated in FIGS. 5 and 6 and comprised of a rectangular body portion including a pocket 43 having the Hall switch situated therein. Guide arms 42 and 44 positioned on opposite ends of the carrier are arranged to be inserted into channels 26 and 27 formed by L-shaped members 22 and 23 with each guide arm 42 and 44 inserted into a respective channel as seen on FIG. 4. Each guide arm further includes deflectable finger portions arranged to be bent inward providing a friction fit between the carrier 40 ends and channels 26 and 27. The carrier is configured to fit in the air gap between the exterior surface of flange 16 and the interior surface of leg 33 of the return strap. In this manner the Hall cell included in the Hall switch can be precisely positioned perpendicular to the magnetic flux flowing within the air gap. Carrier 40 further includes kerfs 46 for extending terminals 45 from the Hall effect switch and allowing the Hall switch to be connected to exterior circuitry.

Turning now to FIG. 7 the operation of the device will be explained. With no electrical current applied to terminals 29, no magnetic field is generated by coil 19 and thus no magnetic flux flows thru the magnetic circuit. Depending on the type of Hall switch installed, i.e. "normally on" or "normally off" a specific signal is generated and outputted via terminals 45 representative of a no current condition. Such as when the flux density applied to the Hall switch is below the switches operate point. When an electrical current is applied to terminals 29, coil 19 produces a magnetic field which is transmitted via the core 35 through the air gap and the Hall switch and back to the core through return strap 30. When the magnetic flux flowing through the air gap reaches the specific operate density or operate point for the Hall switch used the Hall switch outputs a specific signal via terminals 45 representative of a current applied condition.

Since Hall switches have operate and release characteristics which vary from device to device the adjustable core of the present invention is capable of varying the amount of magnetic flux delivered to the Hall switch. Threaded portion 36 of core 35 allows the core to be advanced toward the Hall switch or backed away from it. The closer the core portion 37 is to the Hall switch the less ampere turns required to "turn on" the Hall element. The position of the core is set during manufacture to get a proper match between the operate sensitivity of the Hall switch and the desired operate and non-operate characteristics of the assembled device.

The present invention has been described with reference to a specific embodiment thereof, for the purpose of illustrating the manner in which the invention may be used to advantage. It would be appreciated by those skilled in the art that the invention is not limited thereto. Accordingly, any and all modifications, variations, or equivalent arrangements which may occur to those skilled in the art should be considered to be within the scope of the invention.

What is claimed is:

1. An electromagnetic device arranged to produce an output signal responsive to an electrical current, said device comprising:
   a magnetic flux generator including a tubular body portion and first and second axially spaced flanges extending perpendicularly from said body portion at opposite ends thereof, an opening running through said body portion and each of said flanges, and a coil of insulated wire wound about said body portion intermediate said flanges, said coil connected to said electrical current generating a field of magnetic flux;

a magnetic circuit including a slidable core situated within said opening and including a first end extending outward of said first flange and a second end proximate said second flange, a flux return path disposed adjacent said coil and including a first end portion mounted to said first flange and a second end portion arranged adjacent to and in spaced relationship with said core second end forming an air gap therebetween, said flux return path further including adjusting means engaging said core first end to said flux return path first end portion and manually adjustable thereat, sliding said core within said opening and providing a magnetic flux density of a specific value within said air gap; and a magnetic switching device mounted within said air gap adjacent said core second end;

whereby, in response to a magnetic flux density of said specific value said switching device is operated producing said output signal.

2. An electromagnetic device as claimed in claim 1, wherein: said core is composed of a shaft of ferromagnetic material and said first end includes a threaded portion.

3. An electromagnetic device as claimed in claim 2, wherein: said flux return path is composed of a magnetically conductive material and said adjusting means comprises a threaded bore on said first end portion, said threaded bore arranged to accept said core threaded portion therein and disposed to rotate in a first or alternatively a second direction.

4. An electromagnetic device as claimed in claim 3, wherein: said core is rotated in said first direction increasing the distance between said core second end and said flux return path second end portion, decreasing said flux density within said air gap.

5. An electromagnetic device as claimed in claim 3, wherein: said core is rotated in said second direction decreasing the distance between said core second end and said flux return path second end portion increasing said flux density within said air gap.

6. An electromagnetic device as claimed in claim 1, wherein: said magnetic switching device is a Hall effect switch.

7. An adjustable flux generator arranged to produce a magnetic flux of a specific density responsive to an electrical current and including a Hall effect switch operable to produce an output signal responsive to said specific magnetic flux density, said adjustable flux generator comprising:

a bobbin, including first and second axially spaced flanges extending perpendicularly from opposite ends of said bobbin, said bobbin further including a bore running longitudinally through said bobbin and said flanges, and a coil of insulated wire wound about said bobbin intermediate said flanges, said coil connected to said electrical current generating a field of magnetic flux;

a core, slidably situated within said bore and including a first threaded end extending outward of said first flange and a second end proximate said second flange;

a flux return path disposed adjacent said coil and including first and second end portions, said first end portion including a threaded aperture and said first end portion mounted to said first flange with said core threaded first end engaging said threaded aperture and said flux return path second end portion arranged adjacent and in spaced relationship to said core second end forming an air gap therebetween;

a removable carrier frame having said Hall effect switch mounted thereat, said frame mounted within said air gap and adjacent said flux return path second end portion with said Hall effect switch adjacent said core second end;

whereby, said core first end is manually adjusted providing said magnetic flux of said specific density within said air gap operating said Hall effect switch, producing said output signal.

8. An adjustable flux generator as claimed in claim 7, wherein: said first flange includes a longitudinal channel on an exterior surface thereof opposite said coil, said channel arranged to contain said flux return path first end portion thereat.

9. An adjustable flux generator as claimed in claim 7, wherein: said second flange includes a pair of longitudinally oriented carrier channels on an exterior surface thereof opposite said coil, said carrier channels arranged parallel and in spaced relationship to each other and disposed to slidably accept said carrier frame therebetween.

10. An adjustable flux generator as claimed in claim 9, wherein: said second flange further includes a pair of L-shaped arms each extending outward of said exterior surface of said second flange forming a rectangular passage therebetween parallel to said carrier channels and arranged to contain said flux return path second end thereat.

11. An adjustable flux generator as claimed in claim 9, wherein: said carrier frame includes left and right surfaces and each of said surfaces include a guide member and at least one arcuately formed finger, each guide member and finger disposed to be slidably inserted into a different one of said carrier channels with said guide members positioning said carrier frame to said second flange and each of said fingers engaged to a respective carrier channel, frictionally holding said carrier frame to said channels.

12. An adjustable flux generator as claimed in claim 7, wherein: said core is comprised of a shaft of ferromagnetic material and said flux return path is composed of a magnetically conductive material and said core is arranged to rotate at said threaded end in a first direction and alternatively a second direction.

13. An adjustable flux generator as claimed in claim 12, wherein: said core is rotated in said first direction sliding said core within said bore toward said Hall effect switch decreasing said air gap and increasing said flux density.

14. An adjustable flux generator as claimed in claim 12, wherein: said core is rotated said second and opposite direction sliding said core within said bore away from said Hall effect switch increasing said air gap and decreasing said flux density.

* * * * *